US012658933B2

(12) United States Patent
Liao et al.

(10) Patent No.: US 12,658,933 B2
(45) Date of Patent: Jun. 16, 2026

(54) TIME INTERLEAVED ANALOG TO DIGITAL CONVERTER AND GAIN CALIBRATION METHOD

(71) Applicant: REALTEK SEMICONDUCTOR CORPORATION, Hsinchu (TW)

(72) Inventors: Yu-Tung Liao, Hsinchu (TW);
Cheng-Hsien Li, Hsinchu (TW);
Tsung-En Wu, Hsinchu (TW);
Bo-Rong Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 117 days.

(21) Appl. No.: 18/672,054

(22) Filed: May 23, 2024

(65) Prior Publication Data

US 2025/0055468 A1 Feb. 13, 2025

(30) Foreign Application Priority Data

Aug. 9, 2023 (TW) ................................. 112129927

(51) Int. Cl.
*H03M 1/00* (2006.01)
*H03M 1/10* (2006.01)

(52) U.S. Cl.
CPC ................................. *H03M 1/1014* (2013.01)

(58) Field of Classification Search
CPC ............. H03M 1/1215; H03M 1/0624; H03M
1/0836; H03M 1/1028; H03M 1/1245;
H03M 1/1023; H03M 1/121; H03M
1/0626; H03M 1/12; H03M 1/1009;
H03M 1/00; H03M 1/46; H03M 1/1038;
H03M 1/0604; H03M 1/1004; H03M
1/06; H03M 1/0609; H03M 1/1033;
H03M 1/1061; H03M 1/1225; H03M 1/183; H03M 1/38; H03M 1/0607; H03M
1/0678; H03M 1/1057; H03M 1/1235;
H03M 1/164; H03M 1/36; H03M 1/002;
H03M 1/0612;
(Continued)

(56) References Cited

U.S. PATENT DOCUMENTS

| | | | | | |
|---|---|---|---|---|---|
| 7,541,952 | B1 * | 6/2009 | Sankaran | ............ | H03M 1/1028 |
| | | | | | 341/120 |
| 7,839,313 | B2 | 11/2010 | Kidambi | | |
| 7,916,051 | B1 * | 3/2011 | Sestok | ................ | H03M 1/1061 |
| | | | | | 341/120 |
| 7,961,123 | B2 * | 6/2011 | Nagarajan | ........... | H03M 1/1057 |
| | | | | | 341/118 |
| 8,604,952 | B2 * | 12/2013 | Kidambi | ............. | H03M 1/0624 |
| | | | | | 341/118 |

(Continued)

FOREIGN PATENT DOCUMENTS

TW          I505648 B      10/2015

OTHER PUBLICATIONS

OA letter of a counterpart TW application (appl. No. 112129927) mailed on Jul. 16, 2024.

*Primary Examiner* — Linh V Nguyen
(74) *Attorney, Agent, or Firm* — WPAT, PC

(57) ABSTRACT

A time-interleaved analog-to-digital converter includes sampling circuits, amplifier circuits, analog-to-digital converter circuits, and a detector circuitry. The sampling circuits are configured to sample an input signal according to first clock signals, to generate first signals. The amplifier circuits are configured to generate second signals according to the first signals. The analog-to-digital converter circuits are configured to convert the second signals to generate digital signals. The detector circuitry is configured to adjust a delay time of each of the first clock signals, and calibrate gains of the amplifier circuits according to the digital signals.

14 Claims, 5 Drawing Sheets

(58) Field of Classification Search
CPC .... H03M 1/0656; H03M 1/0663; H03M 1/08;
H03M 1/0863; H03M 1/10; H03M
1/1205; H03M 1/181; H03M 1/188;
H03M 1/362; H03M 1/50; H03M 1/56;
H03M 1/0614; H03M 1/0631; H03M
1/0639; H03M 1/066; H03M 1/0673;
H03M 1/0695; H03M 1/0697; H03M
1/1014; H03M 1/1019; H03M 1/1052;
H03M 1/109; H03M 1/123; H03M 1/124;
H03M 1/1255; H03M 1/14; H03M 1/147;
H03M 1/203; H03M 1/361; H03M 1/363;
H03M 1/365; H03M 1/44; H03M 1/462;
H03M 1/466
USPC ................. 341/140, 141, 155, 159, 118, 120

See application file for complete search history.

(56) References Cited

U.S. PATENT DOCUMENTS

| | | | | |
|---|---|---|---|---|
| 9,264,059 | B2 * | 2/2016 | Tousi | H03M 1/183 |
| 9,503,115 | B1 * | 11/2016 | Shin | H03M 1/0836 |
| 9,584,145 | B1 * | 2/2017 | Shin | H03M 1/1028 |
| 9,602,116 | B1 * | 3/2017 | Le | H03M 1/1038 |
| 11,636,903 | B2 * | 4/2023 | Ngo | G06F 1/10 |
| | | | | 365/244 |
| 2008/0174461 | A1 * | 7/2008 | Hsu | H03M 1/1061 |
| | | | | 341/118 |
| 2020/0235747 | A1 * | 7/2020 | Kang | H03M 1/0624 |
| 2022/0345142 | A1 * | 10/2022 | Han | H03M 1/1028 |
| 2023/0299783 | A1 * | 9/2023 | Araki | H03M 1/1028 |
| | | | | 341/120 |
| 2024/0056088 | A1 * | 2/2024 | Kim | H03M 1/1215 |

* cited by examiner

TIME INTERLEAVED ANALOG TO DIGITAL CONVERTER AND GAIN CALIBRATION METHOD

BACKGROUND OF THE INVENTION

1. Field of the Invention

The present disclosure relates to an analog-to-digital converter, especially to a time-interleaved analog to digital converter and a gain calibration method thereof that are able to reduce sampling time mismatches to improve accuracy of gain calibration.

2. Description of Related Art

In existing time-interleaved analog-to-digital converters, an input signal is sampled by channels in a fixed sequence. However, in practical applications, clock signals that control the sampling sequence may have mismatches or skews therebetween, leading to inaccuracies in the sampling time points. On the other hand, as the number of channels increases, mismatches caused by process variations and other factors in the actual circuit(s) also increase, potentially leading to gain mismatches among the channels. These various mismatches may interact with each other, thereby affecting the operation of the corresponding calibration circuits and reducing the calibration accuracy. For example, timing mismatches may affect the calculation accuracy of the gain calibration circuits, thereby failing to effectively eliminate gain mismatches among the channels.

SUMMARY OF THE INVENTION

In some aspects of the present disclosure, an object of the present disclosure is, but not limited to, a time-interleaved analog to digital converter and a gain calibration method thereof that are able to reduce sampling time mismatches to improve accuracy of gain calibration, so as to make an improvement to the prior art.

In some aspects of the present disclosure, a time-interleaved analog-to-digital converter includes a plurality of sampling circuits, a plurality of amplifier circuits, a plurality of analog-to-digital converter circuits, and a detector circuitry. The plurality of sampling circuits are configured to sample an input signal according to a plurality of first clock signals, to generate a plurality of first signals. The plurality of amplifier circuits are configured to generate a plurality of second signals according to the plurality of first signals. The plurality of analog-to-digital converter circuits are configured to convert the plurality of second signals to generate a plurality of digital signals. The detector circuitry is configured to adjust a delay time of each of the plurality of first clock signals, and calibrate gains of the plurality of amplifier circuits according to the plurality of digital signals.

In some aspects of the present disclosure, a gain calibration method includes the following operations: sampling an input signal according to a plurality of first clock signals to generate a plurality of first signals; amplifying, by a plurality of amplifier circuits, the plurality of first signals to generate a plurality of second signals; performing a plurality of analog-to-digital conversions according to the plurality of second signals to generate a plurality of digital signals; and adjusting a delay time of each of the plurality of first clock signals and calibrating gains of the plurality of amplifier circuits according to the plurality of digital signals.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For case of understanding, like elements in various figures are designated with the same reference number.

Figure 1:
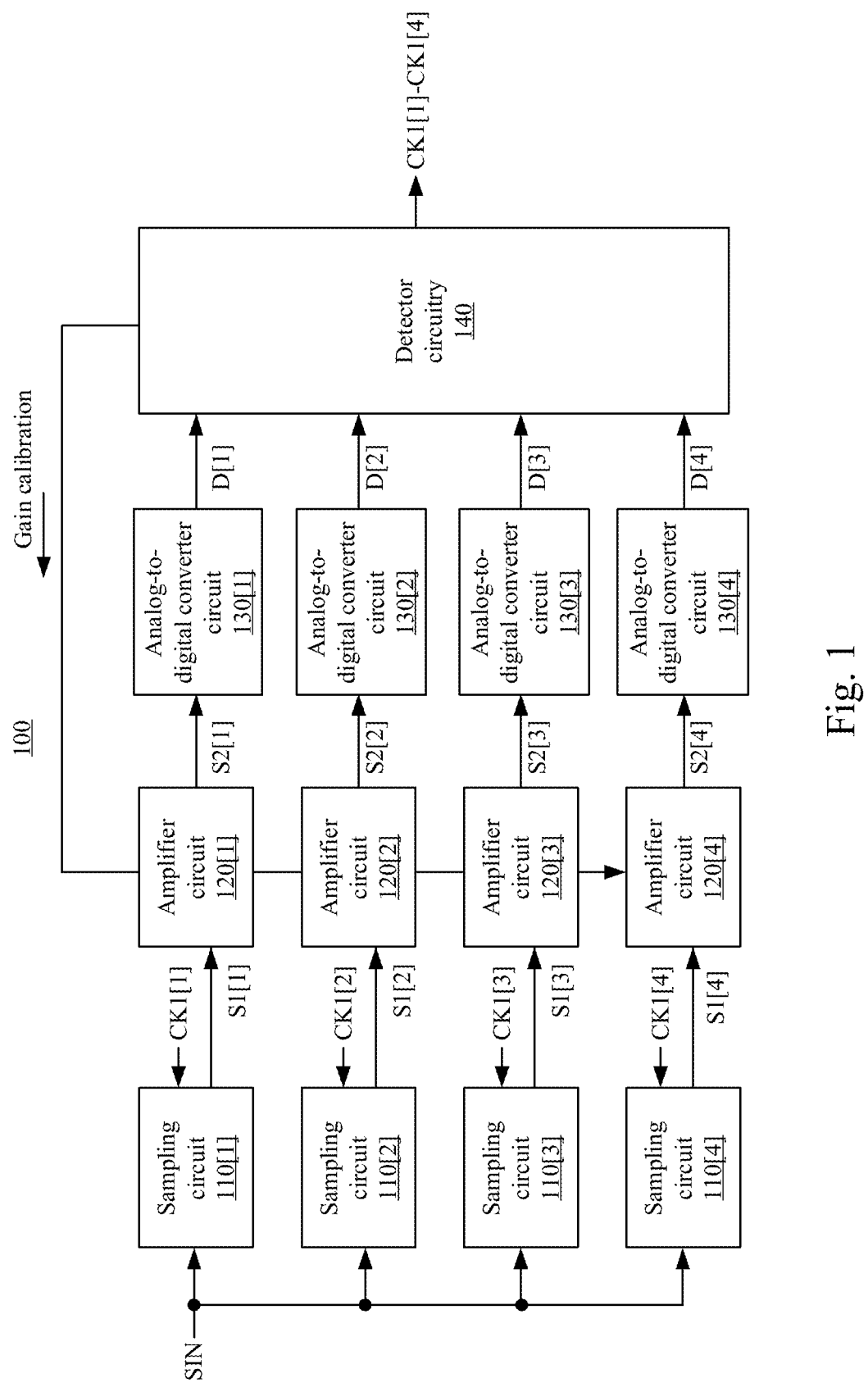
FIG. 1 illustrates a schematic diagram of a time-interleaved analog-to-digital converter according to some embodiments of the present disclosure.

FIG. 1 illustrates a schematic diagram of a time-interleaved analog-to-digital converter 100 according to some embodiments of the present disclosure. The time-interleaved analog-to-digital converter 100 includes sampling circuits 110[1]-110[4], amplifier circuits 120[1]-120[4], analog-to-digital converter circuits 130[1]-130[4], and a detector circuitry 140. The sampling circuits 110[1]-110[4] sample an input signal SIN according to clock signals CK1[1]-CK1[4], in order to respectively generate signals S1[1]-S1[4]. In greater detail, the sampling circuit 110[1] is selectively turned on according to the clock signal CK1[1] to sample the input signal SIN to generate the signal S1[1]. With this analogy, it is understood the correspondence among the sampling circuits 110[2]-110[4], the clock signals CK1[2]-CK1[4], and the signals S1[2]-S1[4]. In some embodiments, each of the sampling circuits 110[1]-110[4] may include, but is not limited to, a switch (not shown) and a capacitive element (not shown). The switch may be turned on according to one of the clock signals CK1[1]-CK1[4]-transmit the input signal SIN to the capacitive element. The capacitive element may store the input signal SIN to generate one of the signals S1[1]-S1[4]. With the above arrangement, the sampling circuits 110[1]-110[4] may be turned on at different times to sequentially sample the input signal SIN, thereby effectively increasing the overall sampling rate.

The amplifier circuits 120[1]-120[4] are configured to generate signals S2[1]-S2[4] according to the signals S1[1]-S1[4]. In greater detail, the amplifier circuit 120[1] is configured to generate the signal S2[1] according to the signal S1[1]. With this analogy, it is understood the correspondence among the amplifier circuits 120[2]-120[4], the signals S1[2]-S1[4], and the signals S2[2]-S2[4]. In some embodiments, each of the amplifier circuits 120[1]-120[4] may operate as a buffer circuit to enhance driving capability. For example, each of the amplifier circuits 120[1]-120[4] may be, but is not limited to, a source follower, which has an ideally voltage gain of 1.

The analog-to-digital converter circuits 130[1]-130[4] are configured to convert the signals S2[1]-S2[4] to generate digital signals D[1]-D[4]. In greater detail, the analog-to-digital converter circuit 130[1] may perform analog-to-digital conversion on the signal S2[1] to generate the digital signal D[1]. With this analogy, it is understood the correspondence among the analog-to-digital converter circuits 130[2]-130[4], the signals S2[2]-S2[4], and the digital signals D [2]-D [4]. In different embodiments, the analog-to-digital converter circuits 130[1]-130[4] may be various types of analog-to-digital converter circuits. For example, each of the analog-to-digital converter circuits 130[1]-130[4] may be, but is not limited to, successive approximation register (SAR) analog-to-digital converter circuits, pipeline analog-to-digital converter circuits, flash analog-to-digital converter circuits, or the like.

The detector circuitry 140 is configured to adjust a delay time of each of the clock signals CK1[1]-CK1[4], thereby adjusting the sampling times of the sampling circuits 110[1]-110[4] for the input signal SIN. Thus, the impact of timing mismatch or timing skew among the sampling circuits 110[1]-110[4] may be reduced. On the other hand, the detector circuitry 140 may also be configured to calibrate the gain of at least one of the amplifier circuits 120[1]-120[4] according to the digital signals D[1]-D[4], thereby reducing the gain mismatch between the channels corresponding to the amplifier circuits 120[1]-120[4].

In some embodiments, the detector circuitry 140 may be configured to adjust the delay time of each of the clock signals CK1[1]-CK1[4] within a predetermined period, and perform an averaging operation based on two of the digital signals D[1]-D[4] during this predetermined period to calculate a gain error of one corresponding amplifier circuit of the amplifier circuits 120[1]-120[4], in order to calibrate the gain of the corresponding amplifier according to this gain error. In other words, the timing mismatch among the sampling circuits 110[1]-110[4] may be continuously adjusted within the predetermined period (for example, by gradually increasing the delay time, gradually decreasing the delay time, or randomly changing the delay time), and the impact of the timing mismatch may be reduced by the accumulating and averaging operation within this predetermined period. As a result, the detector circuitry 140 may detect the gain error between the channels corresponding to the amplifier circuits 120[1]-120[4] more accurately, thereby adjusting the gain of the amplifier circuits 120[1]-120[4] more accurately. In some embodiments, the aforementioned predetermined period may be the period for gain calibration of the amplifier circuits 120[1]-120[4]. Related operations of the detector circuitry 140 will be described below with reference to FIGS. 2, 3A, and 3B.

In practical applications, due to the effects of process variation, voltage variation, and/or temperature variation, errors among the circuit elements in the channels of the time-interleaved analog-to-digital converter may exist, causing gain errors between the channels. For example, due to the impact of one or more of the aforementioned variations, the voltage gain of any one of the amplifier circuits 120[1]-120[4] may not be 1. As a result, the performance of the time-interleaved analog-to-digital converter would be degraded. In some related approaches, gain calibration between the channels of a time-interleaved analog-to-digital converter is performed directly without eliminating the impact of timing mismatch. In these approaches, due to the actual timing mismatch and/or bandwidth mismatch among other negative factors, the digital signals generated by the channels in the time-interleaved analog-to-digital converter may have lower accuracy or have distortion. As a result, accurate gain calibration cannot be effectively performed. Compared with the above approaches, in some embodiments of the present disclosure, the detector circuitry 140 may adjust the sampling times of each channel to reduce the impact of timing mismatch on gain calibration, thereby performing gain calibration between the channels more accurately.

In the example of FIG. 1, the time-interleaved analog-to-digital converter 100 includes four channels. For example, the sampling circuit 110[1], the amplifier circuit 120[1], and the analog-to-digital converter circuit 130[1] correspond to the first channel. The sampling circuit 110[2], the amplifier circuit 120[2], and the analog-to-digital converter circuit 130[2] correspond to the second channel. By this analogy, the configuration of the third and fourth channels is understood. The number of channels shown in FIG. 1 is given for illustrative purposes, and the present disclosure is not limited thereto. It is understood that in different embodiments, the time-interleaved analog-to-digital converter 100 may include N channels, where N may be a positive integer greater than or equal to 2.

In some embodiments, the time-interleaved analog-to-digital converter 100 may further include a skew calibration circuit (not shown). Under this condition, the detector circuitry 140 may stop adjusting the delay times of the clock signals CK1[1]-CK1[4] after the gain calibration is completed. In other words, the detector circuitry 140 may only adjust the delay times of the clock signals CK1[1]-CK1[4] during the period of calibrating the gain of the amplifier circuits 120[1]-120[4], thereby improving the accuracy of the gain calibration. After the gain calibration is completed, the detector circuitry 140 may stop adjusting the delay times of the clock signals CK1[1]-CK1[4], in order to avoid affecting the operation of the skew calibration circuit.

Figure 2:
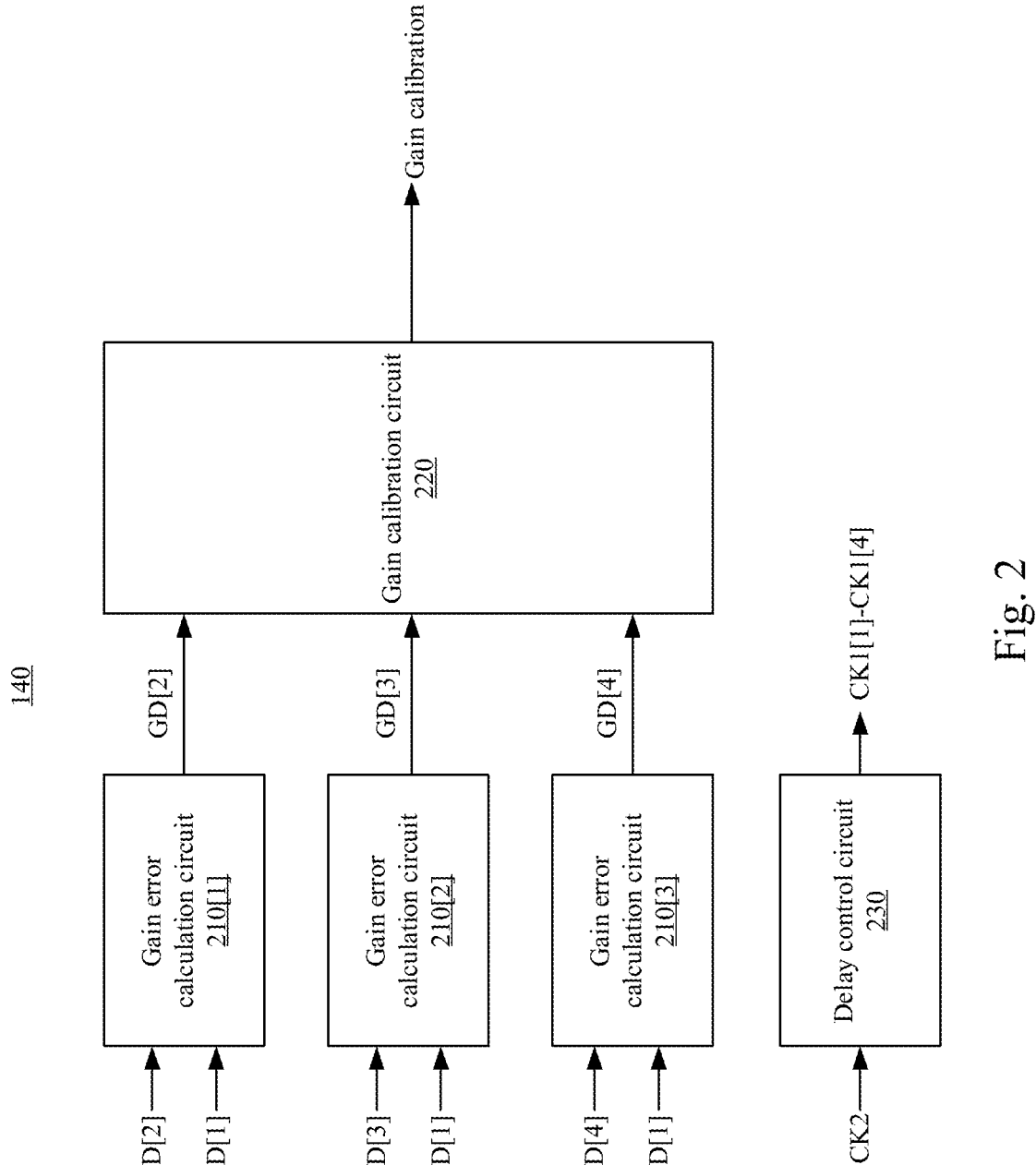
FIG. 2 illustrates a schematic diagram of the detector circuitry in FIG. 1 according to some embodiments of the present disclosure.

FIG. 2 illustrates a schematic diagram of the detector circuitry 140 in FIG. 1 according to some embodiments of the present disclosure. The detector circuitry 140 includes gain error calculation circuits 210[1]-210[3], a gain calibration circuit 220, and a delay control circuit 230.

The gain error calculation circuits 210[1]-210[3] are configured to calculate gain errors GD[2]-GD[4] associated with the amplifier circuits 120[1]-120[4] according to the digital signals D[1]-D[4], to calibrate the gains of those amplifier circuits 120[1]-120[4]. For example, the gain error calculation circuit 210[1] may calculate the gain error GD[2] of the amplifier circuit 120[2] with respect to the amplifier circuit 120[1] according to the digital signals D[1] and D[2]. The gain error calculation circuit 210[2] may calculate the gain error GD[3] of the amplifier circuit 120[3] with respect to the amplifier circuit 120[1] according to the digital signals D[1] and D[3]. Similarly, the gain error calculation circuit 210[3] may calculate the gain error GD[4] of the amplifier circuit 120[4] with respect to the amplifier circuit 120[1] according to the digital signals D[1] and D[4].

The gain calibration circuit 220 may execute a calibration algorithm according to the gain errors determined by the gain error calculation circuits 210[1]-210[3], in order to adjust the gain of at least one of the amplifier circuits 120[1]-120[4]. For example, if the gain error of amplifier circuit 120[2] is larger, the gain calibration circuit 220 may output a control signal to adjust the circuit settings in amplifier circuit 120[2] (which may be, but not limited to, bias settings or programmable gain settings), to calibrate the gain of amplifier circuit 120[2]. In some embodiments, the gain calibration circuit 220 may be implemented with at least one digital circuit capable of executing an existing gain calibration algorithm.

The delay control circuit 230 is configured to gradually adjust the delay time of each of the clock signals CK1[1]-CK1[4] according to the clock signal CK2. For example, the delay control circuit 230 may determine the adjustment amount of delay time (e.g., dly as mentioned below) according to the clock signal CK2, and utilize this adjustment amount dly to adjust the clock signals CK1[1]-CK1[4]. In some embodiments, the frequency of the clock signal CK2 is the same as the frequency of each of the clock signals CK1[1]-CK1[4]. In some embodiments, target phases of the clock signals CK1[1]-CK1[4] are sequentially different by a predetermined phase difference. For example, the target phase of the clock signals CK1[1]-CK1[4] may be sequentially set to 0 degrees, 90 degrees, 180 degrees, and 270 degrees, allowing the sampling circuits 110[1]-110[4] being turned on at different periods.

To put it another way, in some embodiments, based on mathematical concepts, the sampling time t (i) for the sampling circuits 110[1]-110[4] in FIG. 1 may be expressed by the following equation:

$$t(i) = T(i) + \tau(i) + dly, \, i = 1, 2, 3, 4$$

where T (i) is the target time point (corresponding to the target phase) for sampling the input signal SIN by a corresponding sampling circuit in the sampling circuits 110[1]-110[4] (e.g., the sampling circuit 110[i]) according to a corresponding clock signal of the clock signals CK1[1]-CK1[4] (for example, clock signal CK1[i]),τ(i) is the timing error associated with the sampling circuit 110[i], and dly is the adjustment amount for the delay time of a corresponding clock signal (for example, clock signal CK1[i]) of the clock signals CK1[1]-CK1 [4]. From the above equation, it may be understood that during the gain calibration process by the detector circuitry 140, a delay time adjustment amount may be added to the sampling times of the sampling circuits 110[1]-110[4]. Thus, the detector circuitry 140 may utilize accumulation and averaging operations in the calculations for gain calibration to reduce the impact of timing mismatch on gain calibration, thereby increasing the accuracy of gain calibration.

In the above example, the detector circuitry 140 introduces the same delay time adjustment amount to the clock signals CK1[1]-CK1[4], but the present disclosure is not thereto. In other embodiments, the detector circuitry 140 may also introduce different delay time adjustment amounts to the clock signals CK1[1]-CK1[4]. For example, the detector circuitry 140 may include multiple delay control circuits 230, and each delay control circuit 230 is configured to determine the delay time adjustment amount for a corresponding clock signal of the clock signals CK1[1]-CK1[4].

Figure 3A:
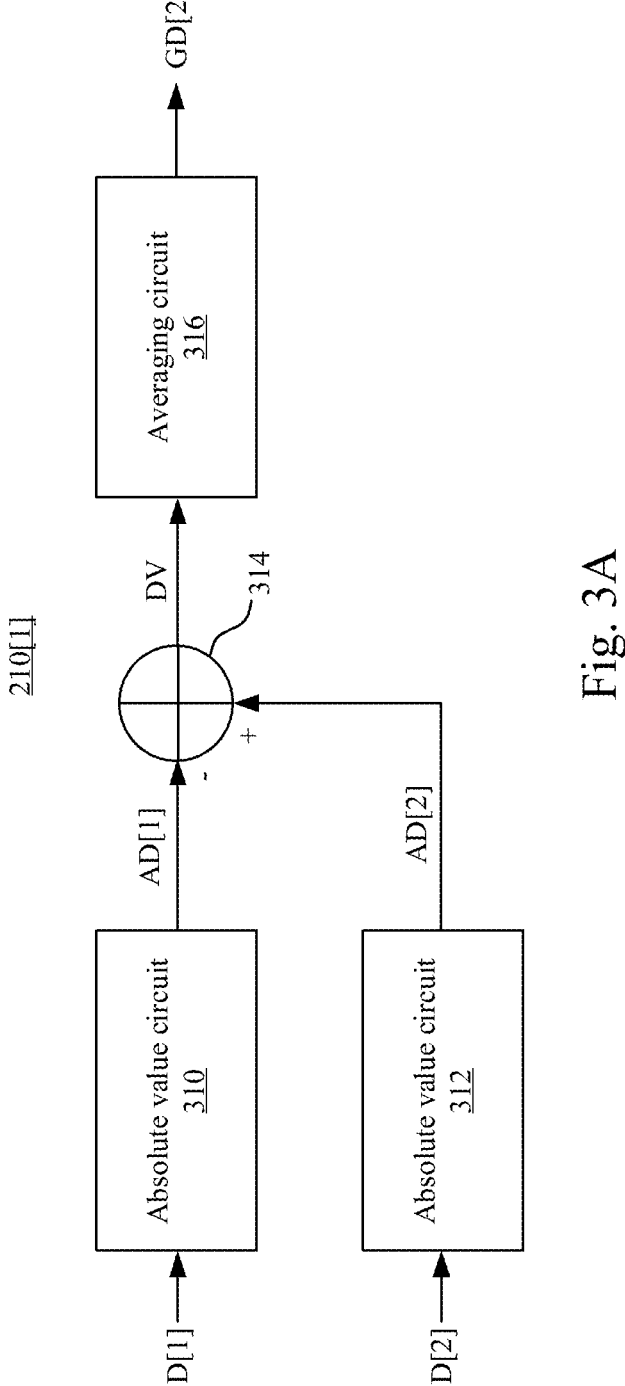
FIG. 3A illustrates a schematic diagram of the gain error calculation circuit in FIG. 2 according to some embodiments of the present disclosure.

FIG. 3A illustrates a schematic diagram of the gain error calculation circuit 210[1] in FIG. 2 according to some embodiments of the present disclosure. In this example, the gain error calculation circuit 210[1] may include an absolute value circuit 310, an absolute value circuit 312, a subtractor circuit 314, and an averaging circuit 316.

The absolute value circuit 310 is configured to generate an absolute value signal AD[2] according to a first digital signal (for example, the digital signal D[2]) of the digital signals D[1]-D[4], where the value of the absolute value signal AD[2] is the absolute value of the digital signal D[2]. The absolute value circuit 312 is configured to generate an absolute value signal AD[1] according to a second digital signal (for example, digital signal D[1]) of the digital signals D[1]-D[4], where the value of the absolute value signal AD[1] is the absolute value of the digital signal D[1]. The subtractor circuit 314 is configured to determine a difference DV between the absolute value signal AD[2] and the absolute value signal AD[1]. The averaging circuit 316 is configured to average this difference DV to determine the gain error GD[2] of a corresponding amplifier circuit of the amplifier circuits 120[1]-120[4] (which may be, in this example, the amplifier circuit 120[2]). For example, the averaging circuit 316 may accumulate the difference DV over the aforementioned predetermined period and average the accumulated result to determine the gain error GD[2].

In the above example, the gain of the channel corresponding to the amplifier circuit 120[1] is set as a reference value. Thus, by comparing the digital signal D[1] related to the aforementioned reference value with the other digital signals D[2]-D[4] (that is, the other digital signals related to the gains of the channels corresponding to the other amplifier circuits 120[2]-120[4]), the gain errors among the amplifier circuits 120[2]-120[4] may be determined.

In some embodiments, each of the absolute value circuit 310, the absolute value circuit 312, the subtractor circuit 314, and the averaging circuit 316 may be implemented with at least one digital logic circuit. The arrangements of the gain error calculation circuit 210[1] described above are given for illustration purposes, and the present disclosure is not limited thereto. For example, each of the absolute value circuits 310 and 312 may alternatively be implemented with, but not limited to, a squaring circuit or a square root circuit. The arrangements of the other gain error calculation circuits 210[2]-210[3] in FIG. 2 can be understood with reference to FIG. 3A, and thus is not further given here.

Figure 3B:
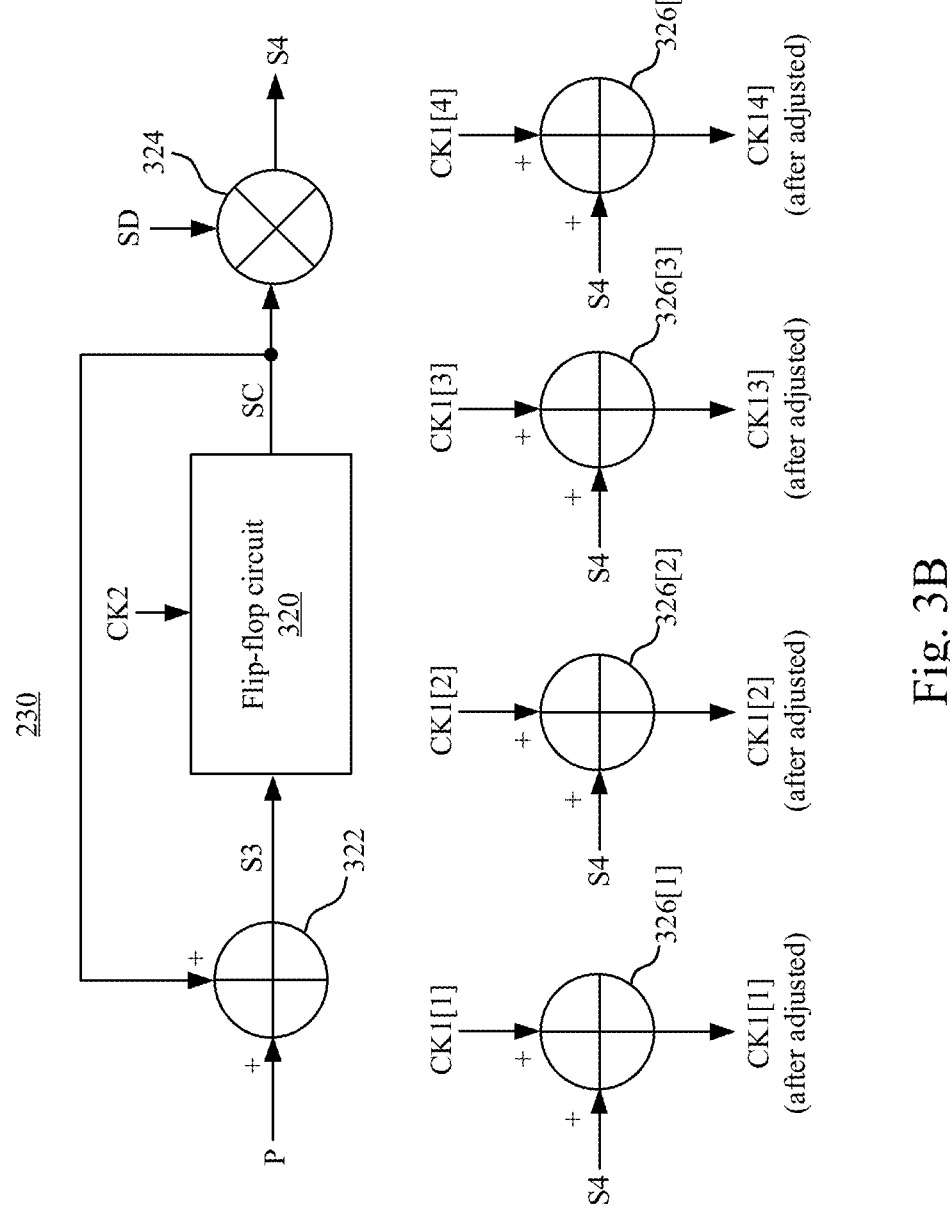
FIG. 3B illustrates a schematic diagram of the delay control circuit in FIG. 2 according to some embodiments of the present disclosure.

FIG. 3B illustrates a schematic diagram of the delay control circuit 230 in FIG. 2 according to some embodiments of the present disclosure. In this example, the delay control circuit 230 includes a flip-flop circuit 320, an adder circuit 322, a multiplier circuit 324, and adder circuits 326[1]-326[4].

The flip-flop circuit 320 is configured to output the signal S3 as a count signal SC according to the clock signal CK2. In some embodiments, the flip-flop circuit 320 may be, but is not limited to, a D-type flip-flop circuit. The adder circuit 322 is configured to add the count signal SC and a predetermined value P to generate the signal S3. In some embodiments, the predetermined value P may be set to, but is not limited to, 1. The multiplier circuit 324 is configured to multiply the signal S3 and the delay signal SD to generate a signal S4, where the delay signal SD corresponds to a unit delay adjustment amount, and the signal S4 is configured to indicate the delay time adjustment amount dly. With the above arrangements, when being triggered by the clock signal CK2, the flip-flop circuit 320 may continuously update the count signal SC, thereby gradually increasing the adjustment amount dly. The adder circuits 326[1]-326[4] may add the signal S4 to the clock signals CK1[1]-CK1[4] respectively, thereby adjusting the delay times of the clock signals CK1[1]-CK1[4].

As previously mentioned, in some embodiments, the detector circuitry 140 may stop adjusting the delay times of the clock signals CK1[1]-CK1[4] after the gain calibration is completed. In other words, during the gain calibration process, the adder circuits 326[1]-326[4] may add the signal S4 to the clock signals CK1[1]-CK1[4] respectively, and output the sum as the updated clock signals CK1[1]-CK1[4], in order to adjust the sampling times of the sampling circuits 110[1]-110[4]. After the gain calibration is completed, the adder circuits 326[1]-326[4] may stop operating and stop adjusting the delay times. Under these conditions, the detector circuitry 140 may utilize other circuits (for example, but not limited to, multiplexers) to provide the clock signals CK1[1]-CK1[4] to the sampling circuits 110[1]-110[4] without adjusting the delay times.

In some embodiments, each of the flip-flop circuit 320, the adder circuit 322, the multiplier circuit 324, and the adder circuits 326[1]-326[4] may be implemented with at least one digital logic circuit. The circuit arrangements shown in FIG. 3B are given for illustrative purposes, and the present disclosure is not thereto. In different embodiments, the delay control circuit 230 may gradually decrease the adjustment amount dly within the predetermined period, alternately increase and decrease the adjustment amount dly, or randomly change the adjustment amount dly. All such variations in changing the adjustment amount dly are within the contemplated scope of the present disclosure.

Figure 4:
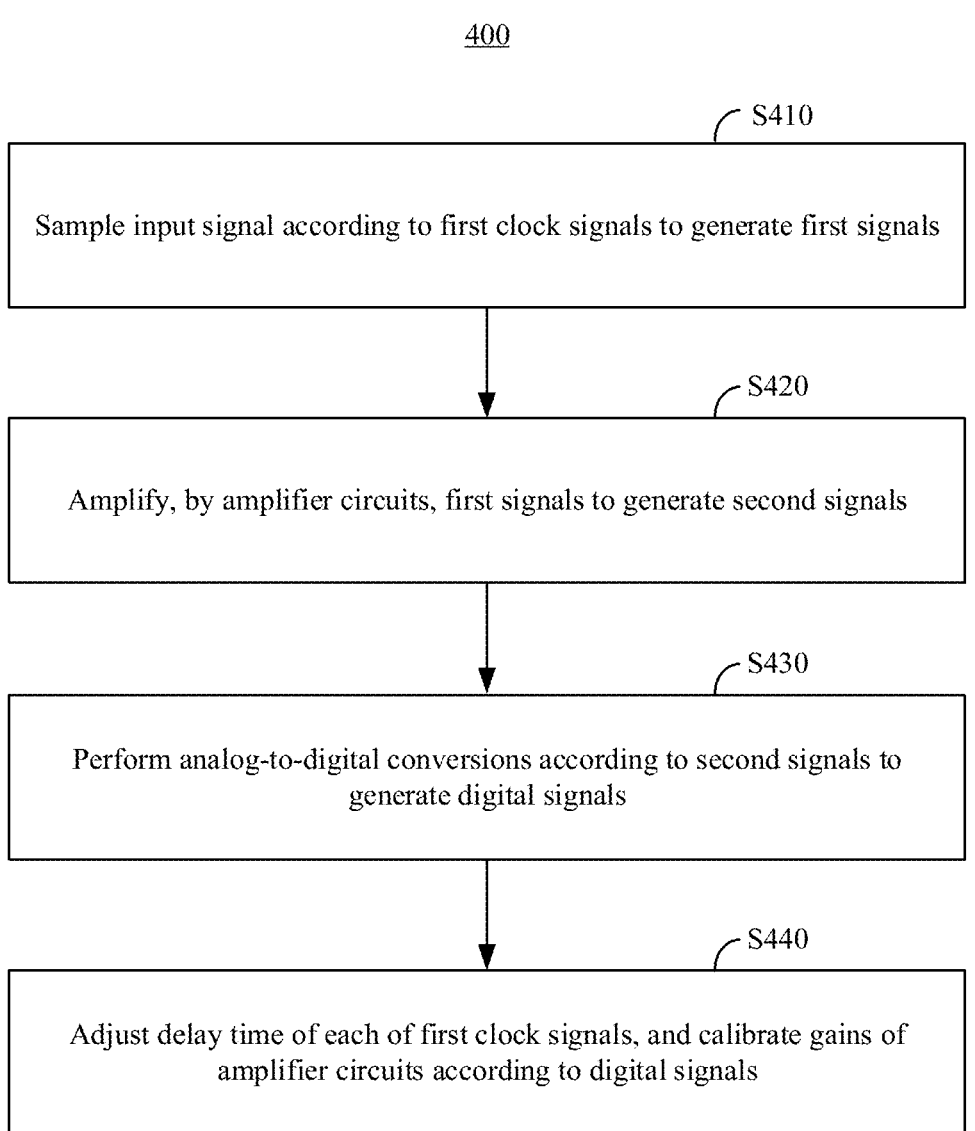
FIG. 4 illustrates a flowchart of a gain calibration method according to some embodiments of the present disclosure.

FIG. 4 illustrates a flowchart of a gain calibration method 400 according to some embodiments of the present disclosure. In operation S410, an input signal is sampled according to first clock signals to generate first signals. In operation S420, the first signals are amplified by the amplifier circuits to generate second signals. In operation S430, analog-to-digital conversions are performed according to the second signals to generate digital signals. In operation S440, a delay time of each of the first clock signals is adjusted, and gains of the amplifier circuits are calibrated according to the digital signals.

Operations of the gain calibration method 400 can be understood with reference to the above embodiments, and thus the repetitious descriptions are not further given. The above operations of the gain calibration method 400 include exemplary operations, but those operations are not necessarily performed in the order described above. Operations of the gain calibration method 400 may be added, replaced, changed order, and/or eliminated, or the operations of the gain calibration method 400 may be performed simultaneously or partially simultaneously as appropriate, in accordance with the spirit and scope of various embodiments of the present disclosure. For example, the gain calibration method 400 may further include the following operation(s): whether the gain error of all amplifier circuits is less than or equal to a target value is determined. If the gain error is less than or equal to the target value, the gain calibration ends. Alternatively, if the gain error is not less than or equal to the target value, the gain calibration method 400 will be performed again, in order to continuously perform the gain calibration.

As described above, the time-interleaved analog-to-digital converter and gain calibration method provided by some embodiments of the present disclosure may adjust the sampling times of the channels during the period of gain calibration, in order to reduce the impact of timing mismatches between the channels and to enhance the accuracy of gain calibration.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog-to-digital converter, comprising:

a plurality of sampling circuits configured to sample an input signal according to a plurality of first clock signals, to generate a plurality of first signals;

a plurality of amplifier circuits configured to generate a plurality of second signals according to the plurality of first signals;

a plurality of analog-to-digital converter circuits configured to convert the plurality of second signals to generate a plurality of digital signals; and a detector circuitry configured to adjust a delay time of each of the plurality of first clock signals, and calibrate gains of the plurality of amplifier circuits according to the plurality of digital signals, wherein the detector circuitry comprises:

a flip-flop circuit configured to output a third signal as a count signal according to a second clock signal;

a first adder circuit configured to add the count signal and a predetermined value to generate the third signal; and a multiplier circuit configured to multiply the third signal and a delay signal to generate a fourth signal, wherein the fourth signal is configured to indicate an adjustment amount of the delay time; and a plurality of second adder circuits configured to add the fourth signal to the plurality of first clock signals respectively, in order to adjust the plurality of first clock signals.

2. The time-interleaved analog-to-digital converter of claim 1, wherein the detector circuitry is configured to adjust the delay time within a predetermined period, and performs an averaging operation according to two of the plurality of digital signals within the predetermined period to calculate a gain error of a corresponding amplifier circuit in the plurality of amplifier circuits, in order to calibrate the gain of the corresponding amplifier circuit according to the gain error.

3. The time-interleaved analog-to-digital converter of claim 1, wherein the detector circuitry is configured to gradually adjust the delay time within a predetermined period.

4. The time-interleaved analog-to-digital converter of claim 3, wherein the detector circuitry is further configured to stop adjusting the delay time after the predetermined period.

5. The time-interleaved analog-to-digital converter of claim 3, wherein the predetermined period is a period for the detector circuitry to calibrate the gains of the plurality of amplifier circuits.

6. The time-interleaved analog-to-digital converter of claim 1, wherein the detector circuitry further comprises:

a plurality of gain error calculation circuits configured to calculate gain errors associated with the plurality of amplifier circuits according to the plurality of digital signals, in order to calibrate the gains of the plurality of amplifier circuits.

7. The time-interleaved analog-to-digital converter of claim 6, wherein one of those gain error calculation circuits comprises:

a first absolute value circuit configured to generate a first absolute value signal according to a first digital signal of the plurality of digital signals, wherein a value of the first absolute value signal is an absolute value of the first digital signal;

a second absolute value circuit configured to generate a second absolute value signal according to a second digital signal in the plurality of digital signals, wherein a value of the second absolute value signal is an absolute value of the second digital signal;

a subtractor circuit configured to determine a difference between the first absolute value signal and the second absolute value signal; and an averaging circuit configured to average the difference to determine a gain error of one corresponding amplifier circuit of the plurality of amplifier circuits.

8. The time-interleaved analog-to-digital converter of claim 1, wherein the predetermined value is 1.

9. A gain calibration method, comprising:

sampling an input signal according to a plurality of first clock signals to generate a plurality of first signals;

amplifying, by a plurality of amplifier circuits, the plurality of first signals to generate a plurality of second signals;

performing a plurality of analog-to-digital conversions according to the plurality of second signals to generate a plurality of digital signals; and adjusting a delay time of each of the plurality of first clock signals and calibrating gains of the plurality of amplifier circuits according to the plurality of digital signals, wherein adjusting the delay time of each of the plurality of first clock signals and calibrating the gains of the plurality of amplifier circuits according to the plurality of digital signals comprises:

outputting, by a flip-flop circuit, a third signal as a count signal according to a second clock signal;

adding, by a first adder circuit, the count signal and a predetermined value to generate the third signal; and multiplying, by a multiplier circuit, the third signal and a delay signal to generate a fourth signal, wherein the fourth signal is configured to indicate an adjustment amount of the delay time; and adding, by a plurality of second adder circuits, the fourth signal to the plurality of first clock signals respectively, in order to adjust the plurality of first clock signals.

10. The gain calibration method of claim 9, wherein adjusting the delay time of each of the plurality of first clock signals and calibrating the gains of the plurality of amplifier circuits according to the plurality of digital signals comprises:

adjusting the delay time within a predetermined period; and performing an averaging operation according to two of the plurality of digital signals within the predetermined period to calculate a gain error of a corresponding amplifier circuit in the plurality of amplifier circuits, in order to calibrate the gain of the corresponding amplifier circuit according to the gain error.

11. The gain calibration method of claim 9, wherein adjusting the delay time of each of the plurality of first clock signals and calibrating the gains of the plurality of amplifier circuits according to the plurality of digital signals comprises:

gradually increasing or decreasing the delay time within a predetermined period.

12. The gain calibration method of claim 11, further comprising:

stopping adjusting the delay time after the predetermined period.

13. The gain calibration method of claim 11, wherein the predetermined period is a period for calibrating the gains of the plurality of amplifier circuits.

14. The gain calibration method of claim 9, wherein adjusting the delay time of each of the plurality of first clock signals and calibrating the gains of the plurality of amplifier circuits according to the plurality of digital signals comprises:

calculating a plurality of gain errors associated with the plurality of amplifier circuits according to the plurality of digital signals, in order to calibrate the gains of the plurality of amplifier circuits.

* * * * *